(12) United States Patent
Lee

(10) Patent No.: US 7,602,111 B2
(45) Date of Patent: Oct. 13, 2009

(54) PLASMA ACCELERATING APPARATUS AND PLASMA PROCESSING SYSTEM INCLUDING SECONDARY ELECTRON AMPLIFICATION COATING LAYER FORMED AT INNER WALL OF CHANNEL

(75) Inventor: Won-tae Lee, Hwaseong-gun (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 410 days.

(21) Appl. No.: 11/406,341

(22) Filed: Apr. 19, 2006

(65) Prior Publication Data
US 2007/0013284 A1    Jan. 18, 2007

(30) Foreign Application Priority Data
Jul. 12, 2005    (KR) .................. 10-2005-0062782

(51) Int. Cl.
    H01J 27/00    (2006.01)
    C23C 14/00    (2006.01)
    C23F 1/02     (2006.01)
    H01J 7/24     (2006.01)

(52) U.S. Cl. .............. 313/231.31; 313/359.1; 313/362.1; 315/111.91; 315/111.41

(58) Field of Classification Search .......... None
    See application file for complete search history.

(56) References Cited

U.S. PATENT DOCUMENTS 6,824,363 B2 * 11/2004 Mitrovic et al. ............... 417/48
6,903,521 B2   6/2005 Park
2003/0184235 A1 * 10/2003 Nakamura ............. 315/111.21

FOREIGN PATENT DOCUMENTS

| JP | 03-150840 A   | 6/1991 |
| JP | 04-229619 A   | 8/1992 |
| JP | 06-089875 A   | 3/1994 |
| JP | 09-167766 A   | 6/1997 |
| JP | 10-022265 A   | 1/1998 |
| JP | 2003-274633 A | 9/2003 |

(Continued)

OTHER PUBLICATIONS

Nozawa et al., Japanese Patent 2004-172397, Jun. 2004, machine translation.*

Primary Examiner—Sikha Roy
Assistant Examiner—Tracie Green
(74) Attorney, Agent, or Firm—Sughrue Mion, PLLC

(57) ABSTRACT

A plasma accelerating apparatus and a plasma processing system having the same are provided. The apparatus includes a channel comprising an inner wall, an outer wall spaced apart from the inner wall by a distance for encircling the inner wall, and an end wall connected to an end of the inner wall and the outer wall to form an outlet port at the other ends of the walls; a gas supply portion to supply a gas to an inside of the channel; and a plasma generating and accelerating portion to supply ionization energy to the gas to generate a plasma beam and to accelerate the generated plasma beam toward the outlet port, wherein a coating layer comprising a first layer composed of a carbon nano tube is formed on at least one of the inner wall, the outer wall, and the end wall of the channel.

11 Claims, 6 Drawing Sheets

FOREIGN PATENT DOCUMENTS

| | | | |
|---|---|---|---|
| JP | 2003-282298 A | 10/2003 |
| JP | 2004-158272 A | 6/2004 |
| JP | 2004172397 A * | 6/2004 |
| JP | 2004-200169 A | 7/2004 |
| JP | 2004-306162 A | 11/2004 |
| JP | 2004-353066 A | 12/2004 |
| KR | 2004-0053502 A | 6/2004 |
| WO | 2005/028310 A2 | 3/2005 |

* cited by examiner

PLASMA ACCELERATING APPARATUS AND PLASMA PROCESSING SYSTEM INCLUDING SECONDARY ELECTRON AMPLIFICATION COATING LAYER FORMED AT INNER WALL OF CHANNEL

CROSS-REFERENCE TO RELATED APPLICATIONS

This application claims priority from Korean Patent Application No. 10-2005-0062782, filed on Jul. 12, 2005, the entire contents of which is incorporated herein by reference.

BACKGROUND OF THE INVENTION

1. Field of the Invention

The present invention relates to a plasma accelerating apparatus, and more particularly, to a plasma accelerating apparatus and a plasma processing system having the same, which is used for semiconductor substrate processing for etching and removing a thin film from a substrate or depositing the thin film on the substrate.

2. Description of the Related Art

In recent years, with the increased need of high speed microprocessors and high recording density memories, a technique of reducing a thickness of a gate dielectric substance and a lateral size of a logic element has been actively developed so that many elements can be mounted on one semiconductor chip. There is a technique of reducing a gate length of a transistor to less than 35 nm, a thickness of a gate oxide to less than 0.5 nm, or increasing a number of metallization levels beyond six as an example of the aforementioned technique.

However, in order to implement such a technique, high performance deposition and/or etching devices capable of increasing a mounting density of a device at the time of manufacturing the semiconductor chip, have been required. Among the high performance deposition and/or etching devices, a plasma etcher or a plasma sputtering system using a plasma accelerating apparatus has been widely used.

FIG. 1 is a schematic cut-away perspective view showing a Hall effect plasma accelerating apparatus 10 used for a plasma etcher or a plasma sputtering system as an example of a conventional plasma accelerating apparatus. The Hall effect plasma accelerating apparatus 10 is disclosed in U.S. Pat. No. 5,847,593.

With reference to FIG. 1, the Hall effect plasma accelerating apparatus 10 includes a circular channel 22 having an upper shielded end and a lower open end. (Note that the lower open end faces up in the figure.) An internal circle coil 16, and external circle coils 17, 18, 18', and 19 are coaxially positioned at an inside and an outside of the circle channel 22 in a line. The circle coils 16, 17, 18, 18', and 19 have physically and magnetically isolated polarity to form a magnetic field. A circular anode electrode 24 is connected to a gas supply pipe 25 and ionizes a supplied gas. A cathode electrode 27 is positioned on a magnetic pole of a lower end of a channel 22 and connected to the gas supply line 29, and supplies electrons.

The external circle coils 17, 18, 18', and 19 are divided into an upper coil 17 and lower coils 18, 18' and 19 of separated sections. Encircling an outside of the channel 22 is the upper coil 17 and encircling an opening of the channel 22 are the lower coils 18, 18' and 19. Upper portions of the upper coil 17 and the internal coil 16 are isolated by a dielectric layer 23. A magnetic field of the isolated region is shielded, so that a partially magnetic field intersecting a space portion 20 of the channel 22 is induced at only a region of an opening 22a of the channel 22, but not at an entire portion of the channel 22. A magnetic field formed at positions of the lower coils 18, 18' and 19 partially captures electrons.

Consequently, the Hall effect plasma accelerating apparatus 10 may accelerate only positive ions, and thus cannot accelerate an electrically neutral plasma by a magnetic field formed due to the presence of the anode electrode 24 and the cathode electrode 27. Furthermore, the Hall effect plasma accelerating apparatus 10 laminates a charge on a surface of a substrate on which ions are deposited, causing a loss such as a charge shunt and nothing to occur in a minute pattern that may lead to a formation of a non-uniform etching profile.

FIG. 2 is a cross-sectional view showing a coaxial plasma accelerating apparatus 40 used for a plasma sputtering system or a plasma etcher as another example of a conventional plasma accelerating apparatus. The coaxial plasma accelerating apparatus 40 is disclosed in an article by J. T. Scheuer, et. al., IEEE Tran. on Plasma Sci., VOL. 22, No. 6, 1015, 1994.

Referring to FIG. 2, the coaxial plasma accelerating apparatus 40 includes a circular channel 50 having an upper shield end and a lower open end. The circular channel 50 accelerates plasma produced by discharging an internally introduced gas. A cylindrical cathode electrode 54 is positioned inside the channel 50. A cylindrical anode electrode 52 is positioned at an outside of an opening of the channel 50, which is coaxially spaced apart from the cylindrical cathode electrode 54 by a predetermined distance. In addition, the coaxial plasma accelerating apparatus 40 includes a control coil 64, a cathode coil 56, and an anode coil 58. The control coil 64 controls plasma in the channel 50. The cathode coil 56 is provided inside the cathode electrode 54. The anode coil 58 is provided outside the anode electrode 52.

The coaxial plasma accelerating apparatus 40 generates an electric current flowing through the channel 50 therein and induces a radial magnetic field enclosing the cathode electrode 54 by the generated current by including a channel 50 and a control coil 64. Here, the channel 50 has inner and outer walls in which the anode electrode 52 and the cathode electrode 54 are provided, respectively, and the control coil 64 is provided at an outside of the channel 50. In the coaxial plasma accelerating apparatus 40, a speed of a plasma ion at an outlet port is very high, for example, of about 500 eV, and a direct current discharge by an anode electrode and a cathode electrode is used, and thus plasma ions accelerated from the anode electrode 52 to the cathode electrode 54 collide with the cathode electrode 54 in the channel 50. The cathode electrode 54 is significantly damaged through the collisions to become difficult to be used for an etching process of a semiconductor thin film deposition process.

In order address these and other problems, an inductively coupled discharge type plasma accelerating apparatus 60 shown in FIG. 3 has been suggested. With reference to FIG. 3, the inductively coupled discharge type plasma accelerating apparatus 60 includes a plasma channel 77, an upper circle loop inductor 79, an internal circle loop inductor 71, and an external circle loop inductor 73.

A gas is ionized and accelerated in the plasma channel 77. The plasma channel 77 has a doughnut shape, which includes a downward open outlet port 77a (top part of FIG. 3). The outlet port 77a communicates with a process chamber (not shown) of a plasma etcher or a sputtering system with the plasma accelerating apparatus 60. An upper circle loop inductor 79 is disposed at an end wall 81 of the plasma channel 77. The upper circle loop inductor 79 applies RF energy to the gas in the plasma channel 77 to generate electrons. The generated electrons collide with neutral atoms of the gas to form a plasma beam. Internal and external circle loop inductors 71 and 73 in which coils are wound are disposed at an inner wall 82 and an outer wall 83 of the plasma channel 77, respectively. The internal and external circle loop inductors 71 and 73 are coaxially arranged in a line.

The operation of the plasma accelerating apparatus 60 will now be described with reference to FIG. 4. When a gas is supplied to an inside of the plasma channel 77 from a gas source (not shown), the upper circle loop inductor 79 applies RF energy to the supplied gas to generate electrons. Consequently, the electrons collide with neutral atoms of the gas, and the gas is ionized to produce a plasma beam.

The internal and external circle loop inductors 71 and 73 induce a magnetic field B and a secondary electric current J in the plasma channel 77 to form an electromagnetic force F, which accelerates the plasma beam toward an outlet port 77a of the plasma channel 77.

Since such a plasma accelerating apparatus 60 accelerates ions in the same direction regardless of a polarity of the electromagnetic force F, an anode electrode and a cathode electrode that conventional electrostatic type accelerating apparatuses 10 and 40 require become unnecessary. This leads to a simple construction thereof. Furthermore, the plasma accelerating apparatus 60 adjusts an electric current through the internal and external circle loop inductors 71 and 73. By using the inductors, the generated electromagnetic force F may be more easily adjusted.

However, in the plasma etcher or the sputtering system using the plasma accelerating apparatus 60, an etching rate for an etching or sputtering generation process depends on ion energy and plasma density. Further, plasma density is influenced by RF energy applied to the plasma channel 77, an electromagnetic force F formed by an electric field B and a secondary current J induced inside the plasma channel 77, and an amount of a secondary electron generated in first, second, and third walls 81, 82, and 83 of the plasma channel 77.

That is, in a condition having the same dielectric constant, when a secondary electron emission coefficient is great, the plasma density is increased. A relation between the plasma density and the secondary electron emission coefficient is disclosed in an article of J.J.A.P. Vol 38, 1999, Part 1, No. 9A, p. 5247. Accordingly, the secondary electron emission coefficient becomes an important variable to determine a performance of a plasma etcher or a sputtering system. However, conventionally, the plasma channel 77 has been made of $SiO_2$ such as quartz or a non-conductive material such as Pyrex. Such a material has a disadvantage in that an electron amplification rate is low thus elevating an acceleration voltage because a secondary electron emission coefficient is not a sufficiently high.

In order to address these and other problems, a plasma accelerating apparatus having a MgO coating layer formed on an inner surface of the plasma channel as a secondary electron emission layer emitting a secondary electron has been proposed and used. In the conventional plasma accelerating apparatus, there is a limitation to obtain sufficient secondary electron emission effect in a discharge space of the plasma channel by only a coating layer of a signal material having MgO. Therefore, what is needed is a plasma accelerating apparatus capable of obtaining a sufficient secondary electron emission effect in a discharge space of a plasma channel to optimize a performance of a plasma etcher or a sputtering system.

SUMMARY OF THE INVENTION

Accordingly, it is an aspect of the present invention to provide a plasma accelerating apparatus and a plasma processing system having the same, which include a secondary electron amplification coating layer having secondary optimal electron emission effect formed at an inner wall of a channel in order to enhance plasma generation efficiency.

According to an exemplary embodiment of the present invention, a plasma accelerating apparatus is provided. The plasma accelerating apparatus comprises a channel comprising an inner wall, an outer wall spaced apart from the inner wall by a distance for encircling the inner wall, and an end wall connected to an end of the inner wall and an end of the outer wall to form an outlet port at the other ends of the inner and outer walls; a gas supply portion which is configured to supply a gas to an inside of the channel; and a plasma generating and accelerating portion which is configured to supply ionization energy to the gas inside the channel to generate a plasma beam and to accelerate the generated plasma beam toward the outlet port, wherein a coating layer comprising a first layer composed of a carbon nano tube is formed on an inner surface of at least one of the inner wall, the outer wall, and the end wall of the channel.

The coating layer may further include a second layer made of at least one of an oxide material and a fluoride material. The oxide material may be selected from the group consisting of MgO, CaO, and BaO, and the fluoride material may be selected from the group consisting of $MgF_2$, LiF, CaF, and $BaF_6$. The first layer and the second layer may be about 10 μm or less in thickness.

According to another exemplary embodiment of the present invention, there is provided a plasma processing system comprising a channel including an inner wall, an outer wall spaced apart from the inner wall by a predetermined distance for encircling the inner wall, and an end wall connected to an end of the inner wall and an end of the outer wall to form an outlet port at the other ends of the inner and outer walls; a first gas supply portion which is configured to supply a gas to an inside of the channel; a plasma generating and accelerating portion which is configured to supply ionization energy to the gas inside the channel to generate a plasma beam and to accelerate the generated plasma beam toward the outlet port; and a process chamber communicating with the outlet port of the channel, and including a substrate holder for fixing a substrate, wherein a coating layer including a first layer composed of a carbon nano tube is formed on an inner surface of at least one of the inner wall, the outer wall, and the end wall of the channel.

The coating layer may further include a second layer made of at least one of an oxide material and a fluoride material. The oxide material may be selected from the group consisting of MgO, CaO, and BaO, and the fluoride material may be selected from the group consisting of $MgF_2$, LiF, CaF, and $BaF_6$. The first layer and the second layer may be about 10 μm or less in thickness.

The system may further comprise a second gas supply portion which is configured to supply a process gas into the process chamber.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE PRESENT INVENTION

Hereinafter, a plasma accelerating apparatus and a plasma processing system including the plasma accelerating apparatus according to exemplary embodiments of the present invention will be described in detail with reference to accompanying drawings.

Figure 1:
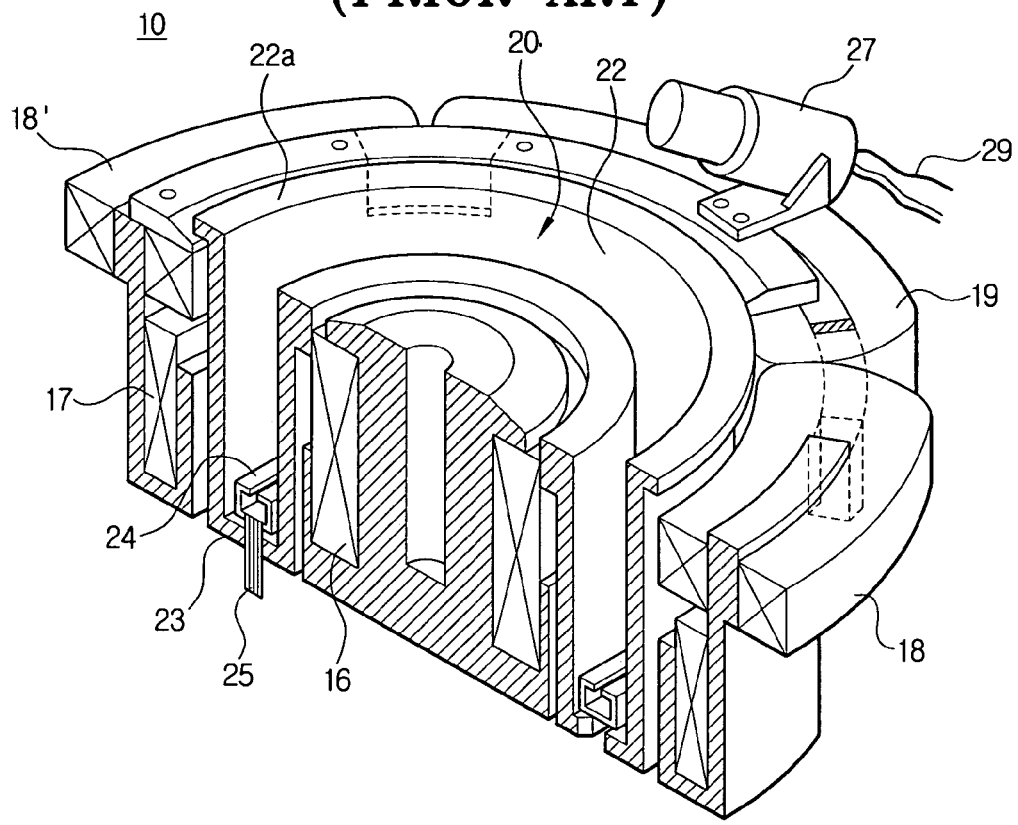
FIG. 1 is a schematic cut-away perspective view showing an example of a conventional plasma accelerating apparatus.
Figure 2:
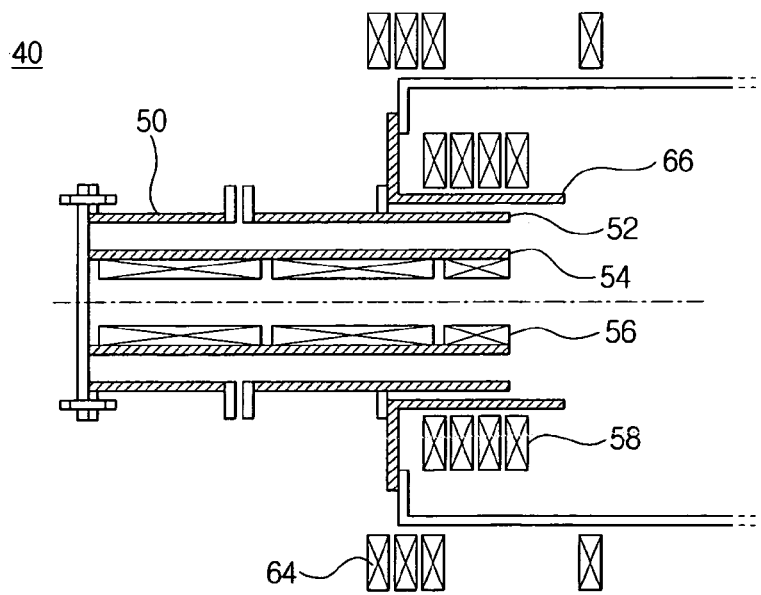
FIG. 2 is a cross-sectional view showing another example of a conventional plasma accelerating apparatus.
Figure 3:
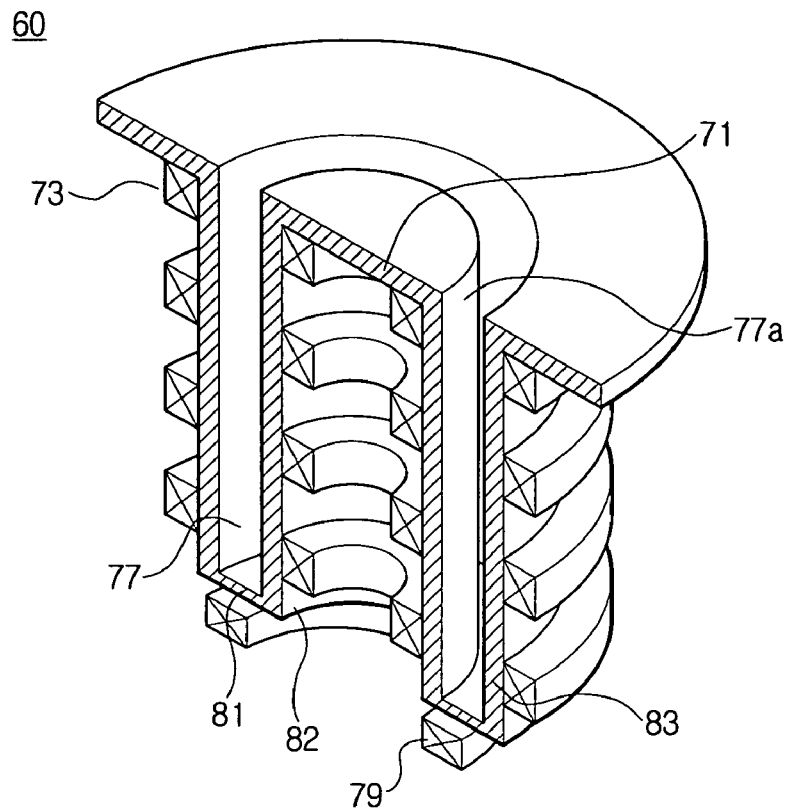
FIG. 3 is a schematic cut-away perspective view showing a further example of a conventional plasma accelerating apparatus.
Figure 4:
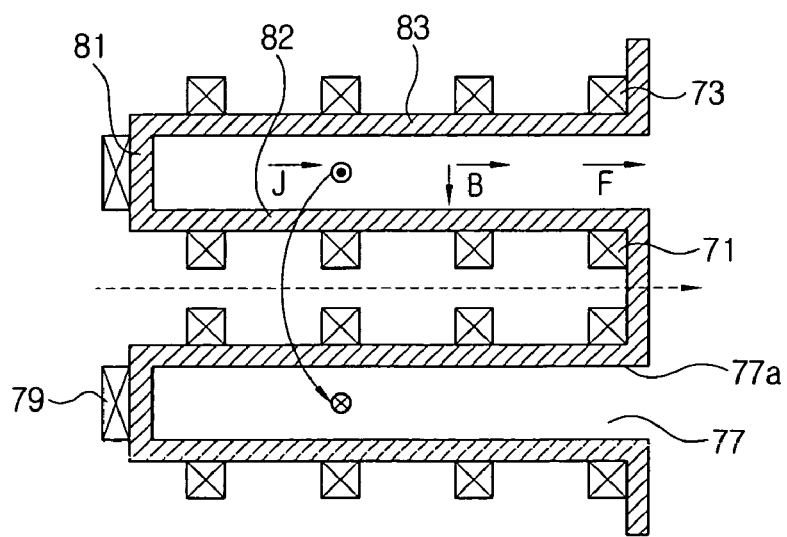
FIG. 4 is a cross-sectional view of the plasma accelerating apparatus shown in FIG. 3.
Figure 5:
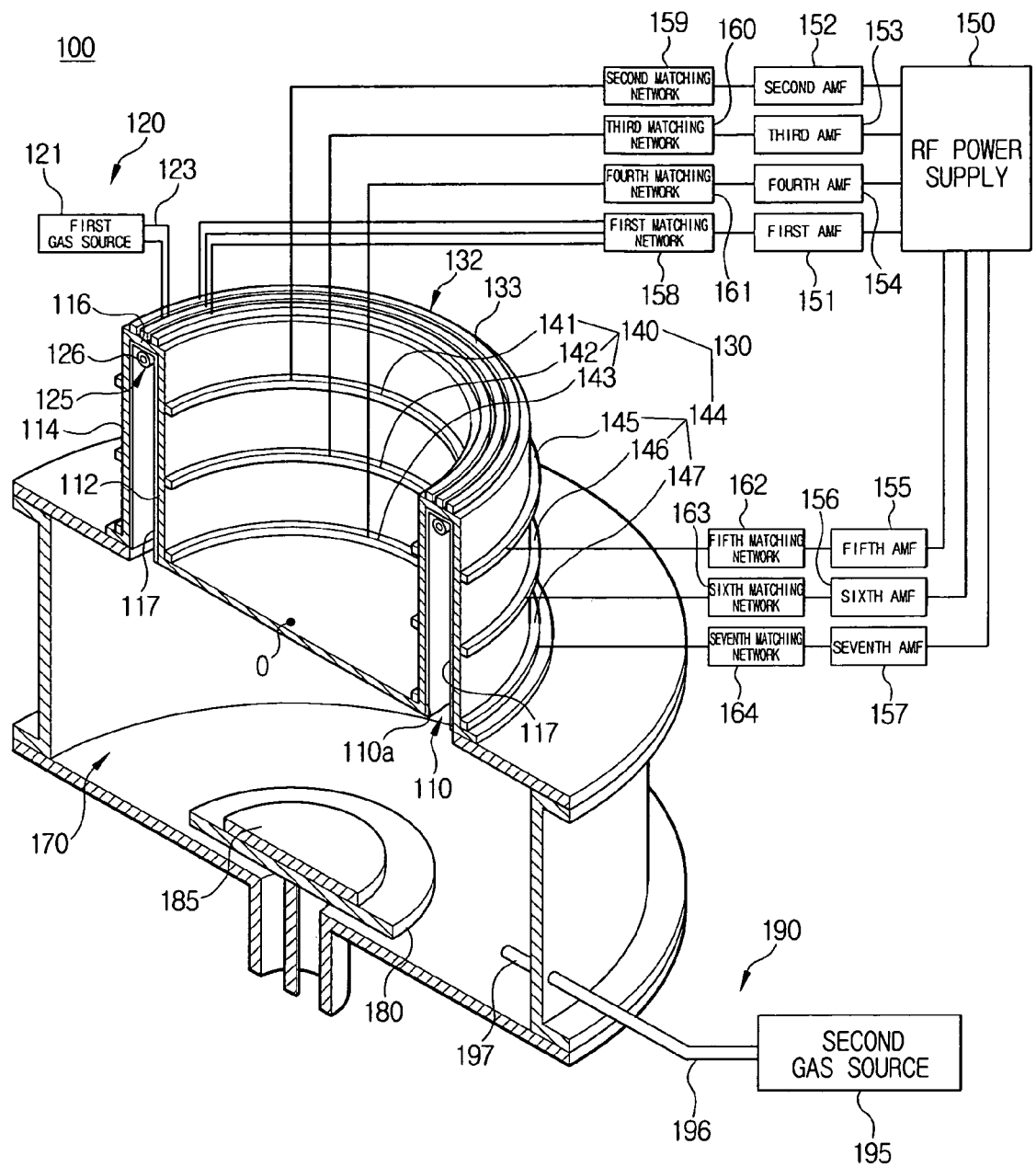
FIG. 5 is a schematic cut-away perspective view showing a plasma processing system including a plasma accelerating apparatus according to an exemplary embodiment of the present invention.

FIG. 5 is a schematic cut-away perspective view showing a plasma processing system 100 including a plasma accelerating apparatus according to an exemplary embodiment of the present invention.

The plasma processing system 100 of the present invention is a plasma etcher that forms a selective etching pattern on a substrate 185 by evaporating or ashing a thin film such as photoresist or other thin film known in the art coated on the substrate using high temperature ionized plasma to remove it therefrom.

With reference to FIG. 5, the plasma processing system 100 includes a plasma channel 110, a first gas supply portion 120, a plasma generating and accelerating portion 130, a process chamber 170, and a second gas supply portion 190. The plasma channel 110, the first gas supply portion 120, and the plasma generating and accelerating portion 130 comprise the plasma accelerating apparatus according to an exemplary embodiment of the present invention.

Figure 6A:
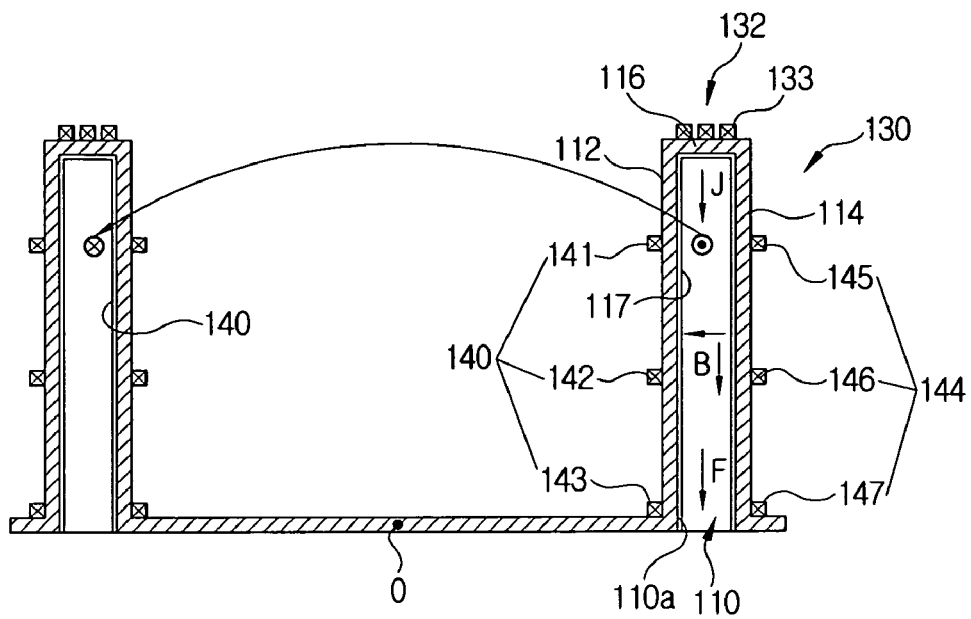
FIG. 6A is a cross-sectional view showing a plasma channel of the plasma processing system shown in FIG. 5.

A gas is ionized and accelerated in the plasma channel 110. The plasma channel 110 has a doughnut shape, which includes an outlet port 110a. The outlet port 110a is open in a discharge direction of a gas. The plasma channel 110 includes an inner wall 112, an outer wall 114, and an end wall 116 for connecting the inner wall 112 and the outer wall 114 to each other. As shown in FIGS. 5 and 6A, the inner wall 112 of the plasma channel 110 is cylindrical in shape. While exemplary embodiments will be described with respect to the cylindrical shape, other shapes such as a square shape or pentagonal shape, etc. are contemplated.

The outer wall 114 has a cylindrical shape with a diameter greater than that of the inner wall 112 by a distance so that a space is formed between the outer wall 114 and the inner wall 112. The distance and/or space may be predetermined. It is advantageous if a distance between the inner wall 112 and the outer wall 114 ranges from about 2 to about 4 cm.

The inner wall 112, the outer wall 114, and the end wall 116 of the plasma channel 110 are made of $SiO_2$ such as quartz or a nonconductive material such as Pyrex. However, other similar materials known in the art may also be used. A secondary electron amplification coating layer 117 is formed at inner surfaces of the inner wall 112, the outer wall 114, and the end wall 116, and emits secondary electrons.

As shown in FIG. 6A, the secondary electron amplification coating layer 117 functions to provide optimum secondary electron emission effect. The secondary electron amplification coating layer 117 is composed of a carbon nano tube (referred to as 'CNT' hereinafter) layer, which is deposited on the inner surfaces of the inner wall 112, the outer wall 114, and the end wall 116 with a thickness of about 10 μm or less using sputtering, electron-beam evaporation, or other depositing method known in the art.

Figure 6B:
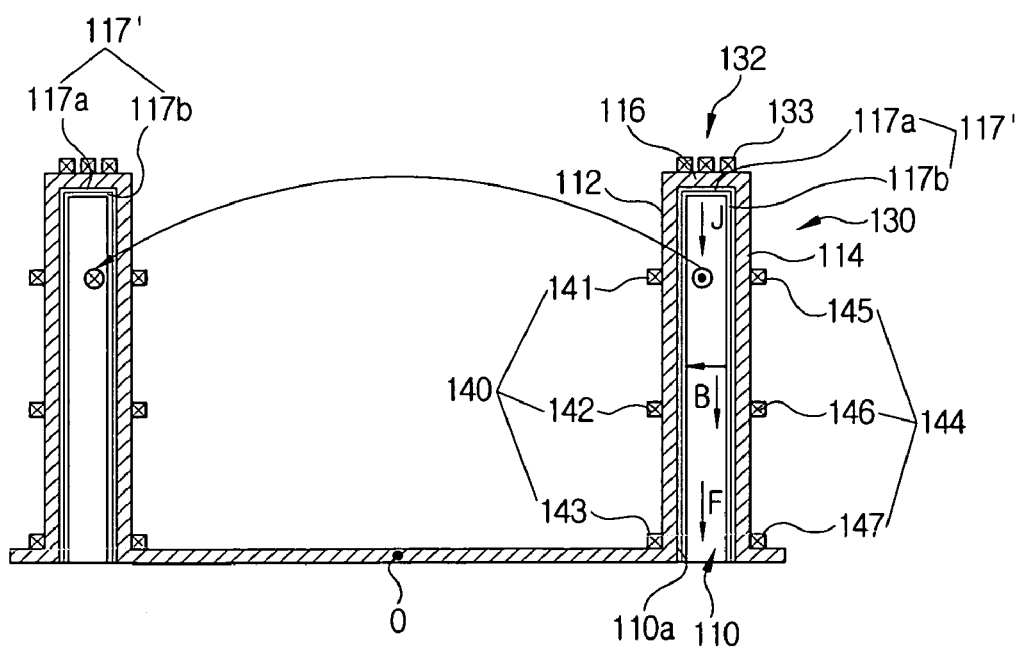
FIG. 6B is a cross-sectional view showing a modified example of the plasma channel of the plasma processing system shown in FIG. 5.

Alternatively, as shown in FIG. 6B, a secondary electron amplification coating layer 117' may be composed of first and second layers 117a and 117b. In the same manner as in the secondary electron amplification coating layer 117, the first layer 117a of the secondary electron amplification coating layer 117' functions to provide optimum secondary electron emission effect. The first layer 117a of the secondary electron amplification coating layer 117' is composed of a CNT layer, which is deposited on the inner surfaces of the inner wall 112, the outer wall 114, and the end wall 116 with a thickness of about 10 μm or less using sputtering, electron-beam evaporation, or other depositing method known in the art. The second layer 117b of the secondary electron amplification coating layer 117' functions to further amplify the secondary electron emission effect. The second layer 117b is composed of an oxide layer or a fluoride layer, which is deposited on the first layer 117a with a thickness of about 10 μm or less using sputtering, electron-beam evaporation, or other depositing method known in the art.

It is advantageous that the oxide layer is made of a material selected from the group consisting of MgO, CaO, and BaO, and the fluoride material is made of one selected from the group consisting of $MgF_2$, LiF, CaF, and $BaF_6$.

Figure 7:
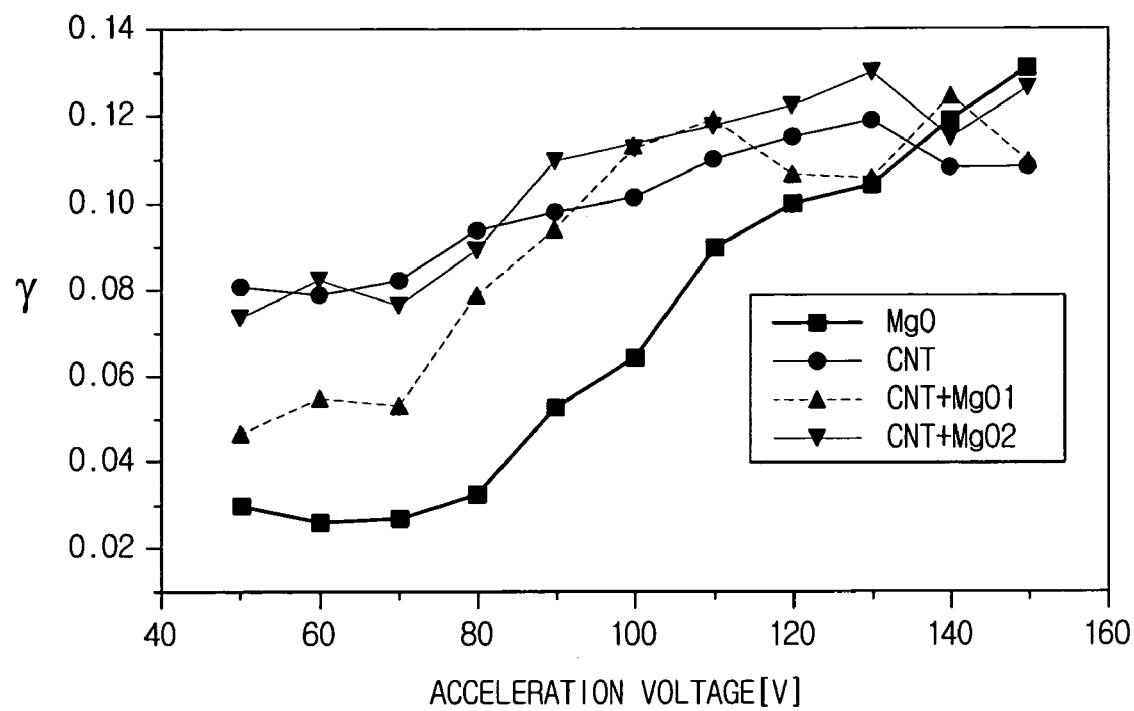
FIG. 7 is a graph that measures a relationship between an acceleration voltage and a secondary electron emission coefficient when forming a secondary electron amplification coating layer according to an exemplary embodiment of the present invention and a coating layer of a compared example at an inner surface of a plasma channel.

FIG. 7 is a graph that measures a relationship between a secondary electron emission coefficient γ due to ions of the second electron amplification coating layers 117 and 117' of an exemplary embodiment of the present invention compared to a secondary electron emission coefficient γ due to ions of an MgO layer of an example by a known method when forming the secondary electron amplification coating layers 117 and 117' and the MgO layer of an example at an inner surface of a plasma channel. In the graph of FIG. 7, reference numeral CNT represents the secondary electron amplification coating layer 117 of the present invention composed of the CNT, and reference numeral MgO represents the MgO layer. Reference numeral CNT+MgO1 notes the secondary electron amplification coating layer 117' including the first layer 117a of CNT and the second layer 117b of MgO, which is 0.3 μm thick. Reference numeral CNT+MgO2 notes the secondary electron amplification coating layer 117' including the first layer 117a of CNT and the second layer 117b of MgO, which is 0.5 μm thick.

As seen from FIG. 7, it will be understood that each of the secondary amplification coating layers 117 and 117' has a secondary electron emission coefficient γ greater than that of an MgO layer of a compared example in a range of an acceleration voltage measured in a real plasma channel 110, for example, in the acceleration voltage of 50 V or less. Accordingly, a plasma density influenced by the secondary electron emission coefficient γ may be increased, and accordingly plasma generation efficiency of the plasma channel 110 is increased. An outlet port 110a of the plasma channel 110 communicates with a process chamber 170.

The first gas supply portion 120 includes a first gas injection portion 125 and a first gas source 121. The first gas injection portion 125 is fixed and installed at an inside of an end wall 116 of the plasma channel 110. The first gas injection portion 125 includes a gas injection ring 126 connected to the first gas source 121 through the first connection pipe 123. The gas injection ring 126 includes a plurality of discharge holes formed in the outlet port 110a side. Each diameter of the discharge holes is smaller than that of the gas injection ring 126. The first gas source 121 stores ionization gases of group 0 such as Ar, and reaction gases such as $O_2$ or $O_2$ compound, and process gases such as $C_2F_2$. Other like gases known in the art are also contemplated.

The plasma generating and accelerating portion 130 is arranged at outer peripheral parts of an inner wall 112, and an outer wall 114, and an end wall 116 of the plasma channel 110. The plasma generating and accelerating portion 130 includes an upper circle loop inductor 132, and internal and external circle loop inductors 140 and 144.

The upper circle loop inductor 132 is provided with an upper circle loop coil 133. The upper circle loop coil 133 is wound around an outside (top part of FIG. 5) of the end wall 116 of the plasma channel 110 by a plurality of turns. An RF power supply 150 applies RF energy of approximately 500 W to approximately 5.0 kW to the upper circle loop coil 133 through a first amplifier 151 and a first matching network 158 connected thereto to operate the upper circle loop coil 133 at a frequency of approximately 2 MHz. In other words, the upper circle loop coil 133 applies RF energy in the gas fed through discharge holes of the gas injection ring 126, causing electrons generated by the RF energy to collide with neutral atoms of the gas. Accordingly, the gas is ionized to generate a plasma beam. The secondary electron amplification coating layer 117 or 117' capable of providing optimum secondary electron emission effect is formed at inner surfaces of the inner wall 112, the outer wall 114, and the end wall 116 of the plasma channel 110, that allows a generation efficiency of the plasma beam formed by the upper circle loop inductor 132 to be enhanced. In addition, an electric current of about 40 A is supplied to the upper circle loop coil 133 through the first amplifier 151 and the first matching network 158 connected to an RF power supply 150.

Consequently, as in a description of a procedure for inducing an electromagnetic force F by the internal and external circle loop inductors 140 and 145 with reference to FIG. 6A, the upper circle loop coil 133 induces an magnetic field B and a secondary electric current J in the plasma channel 110 to generate electromagnetic force F, which accelerates the plasma beam toward the outlet port 110a of the plasma channel 110.

The internal and external circle loop inductors 140 and 144 are disposed at an inside (radial inside of FIG. 5) of the inner wall 112 of the plasma channel 110, and an outside (radial outside of FIG. 5) of the outer wall 114 thereof, respectively. The internal and external circle loop inductors 140 and 144 includes first, second, and third internal circle loop coils 141, 142, and 143, and first, second, and third external circle loop coils 145, 146, and 147, respectively, which are wound by one turn. The first, second, and third internal circle loop coils 141, 142, and 143, and first, second, and third external circle loop coils 145, 146, and 147 are coaxially arranged in a line.

An RF power supply 150 applies RF energy of about 500 W to about 5.0 kW to the first, second, and third internal circle loop coils 141, 142, and 143 through second to fourth amplifiers 152, 153 and 154 and a second to fourth matching networks 159, 160, and 161 connected thereto at a frequency of approximately 2 MHz to operate the first, second, and third internal circle loop coils 141, 142, and 143, respectively. Moreover, the RF power supply 150 applies RF energy of about 500 W to about 5.0 kW to the first, second, and third external circle loop coils 145, 146, and 147 through fifth to seventh amplifiers 155, 156 and 157 and fifth to seventh matching networks 162, 163 and 164 connected thereto to operate the first, second, and third external circle loop coils 145, 146, and 147, at a frequency of about 2 MHz, respectively.

The first, second, and third internal circle loop coils 141, 142, and 143, and first, second, and third external circle loop coils 145, 146, and 147 operate with RF energy of about 500 W to about 5.0 kW at about 2 MHz as in the upper circle loop inductor 132. However, since the first, second, and third internal circle loop coils 141, 142, 143, and the first, second, and third external circle loop coils 145, 146, and 147 are wound by one turn, and are separated by a distance apart from each other, although RF energy is applied to the gas, the plasma beam is hardly formed.

Figure 8:
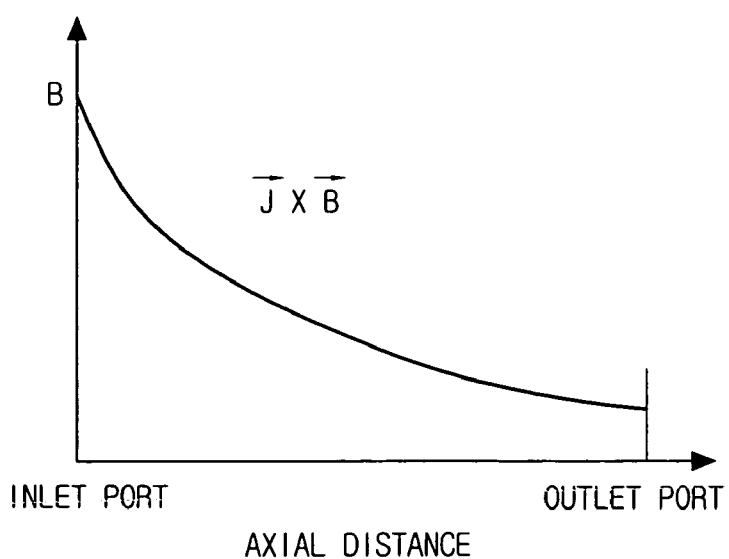
FIG. 8 is a graph showing an intensity of a magnetic field according to an axial length of the plasma channel of the plasma processing system shown in FIG. 4.

Moreover, an electric current supplied to the first, second, and third internal circle loop coils 141, 142, 143, and the first, second, and third external circle loop coils 145, 146, and 147 from the RF power supply 150 through second to seventh amplifiers 152, 153, 154, 155, 156, and 157, and second to seventh matching networks 159, 160, 161, 162, 163, and 164 is gradually reduced in axial direction in the plasma channel 110. The reason is that a magnetic field drifts from a higher magnetic field pressure to a lower magnetic field pressure. That is, since the electric current supplied from the RF power supply 150 to the first, second, and third internal circle loop coils 141, 142, 143, and the first, second, and third external circle loop coils 145, 146, and 147 is sequentially reduced in the axial direction, as shown in FIG. 8, a magnetic field induced inside the plasma channel 110 decreases in the axial direction, namely, toward an outlet port 110a. As a result, a pressure difference of the magnetic field occurs among the first, second, and third internal circle loop coils 141, 142, and 143, and among the first, second, and third external circle loop coils 145, 146, and 147. This causes the plasma beam to be further rapidly accelerated toward an outlet port 110a of the plasma channel 110.

For example, the RF power supply 150 applies electric currents of 60 A, 40 A, and 20 A to the first, second, and third internal circle loop coils 141, 142, and 143 through the second to fourth amplifiers 152, 153, and 154, and the second to fourth matching network 159, 160, 161, respectively. The RF power supply 150 applies electric currents of −25 A, −15 A, and −5 A to the first, second, and third external circle loop coils 145, 146, and 147 through the fifth to seventh amplifiers 155, 156, and 157, and the fifth to seventh matching network 162, 163, 164, respectively.

Consequently, as shown in FIG. 6A, the electric currents flowing through the first, second, and third internal circle loop coils 141, 142, and 143, and through the first, second, and third external circle loop coils 145, 146, and 147 induce a magnetic field B inside the plasma channel 110, and accordingly the induced magnetic field B also induces a secondary current J in accordance with Maxwell's equations.

The secondary current J and the magnetic field B produce an electromagnetic force F in a z axis direction, which accelerates a plasma beam toward an outlet port 110a of the plasma channel 110 regardless of a polarity by equation 1.

$$F = J \times B \tag{1}$$

In addition, the electric currents applied to the first, second, and third internal circle loop coils 141, 142, and 143, and the electric currents applied to the first, second, and third external circle loop coils 145, 146, and 147 are sequentially reduced, and accordingly the magnetic field induced inside the plasma channel 110 is reduced in an axial direction. As a result, due to characteristics of a magnetic field that is drifted from a higher pressure magnetic field pressure to a lower magnetic field pressure, a plasma beam accelerated by the electromagnetic force F is further accelerated toward the outlet port 110a of the plasma channel 110.

As described above, an electromagnetic force F produced by the first and second electric currents flowing through the first, second, and third internal circle loop coils 141, 142, 143, and the first, second, and third external circle loop coils 145, 146, and 147, and the pressure difference of the magnetic field among the first, second, and third internal circle loop coils 141, 142, and 143, and among the first, second, and third external circle loop coils 145, 146, and 147 accelerate the plasma beam. Thus, electrons and positive ions in a plasma beam mix with each other to produce neutral particles having a plasma density of about $10^{11}$ to about $10^{12}$ electrons/cm$^3$ and ion energy of about 20 to about 500 eV, for example.

Although an exemplary embodiment of the present invention has been illustrated that an electric current supplied to the first, second, and third internal circle loop coils 141, 142, 143, and the first, second, and third external circle loop coils 145, 146, and 147 is sequentially reduced in order to reduce the magnetic field inside the plasma channel 110 in an axial direction, the magnetic field induced inside the plasma channel 110 may be reduced in the axial direction by reducing the number of turns of the circle loop coils wound in an axial direction and applying the same current to the first, second, and third internal circle loop coils 141, 142, 143, and the first, second, and third external circle loop coils 145, 146, and 147.

Further, although an exemplary embodiment of the present has been described that the first, second, and third circle loop coils 141, 142, 143, and the first, second, and third external circle loop coils 145, 146, and 147 function to accelerate a plasma beam, they can function to generate the plasma beam by increasing the number of turns of the circle loop coils.

The process chamber 170 communicates with an outlet port 110a of the plasma channel 110. A plasma beam drifted due to the electromagnetic force F and the pressure difference of a magnetic field generated by the magnetic field generating and accelerating portion 130 is supplied to the process chamber 170. The process chamber 170 maintains at a pressure of about 0.3 to about 3 m Torr.

A substrate holder 180 is disposed at an internal center O of the process chamber 170. A substrate 185 on which a thin film such as photoresist or other thin film known in the art to be etched is coated on the substrate 185 is fixed to the substrate holder 180. The substrate holder 180 is made of a copper block heated or cooled by a heating/cooling circuit (not shown). A second gas injection port 197 of the second gas supply portion 190 is disposed at one side of the process chamber 170, and supplies a process gas into the process chamber 170. The second injection port 197 is connected to a second gas source 195 through a connection pipe 196. The second gas source 195 stores a process gas such as $C_2F_2$, or other process gas known in the art.

Although the plasma processing system with a plasma accelerating apparatus according to an exemplary embodiment of the present invention has been described that the secondary electron amplification coating layer 117 or 117' is formed an each of the inner wall 112, outer wall 114, and end wall 116 of the plasma channel 110, the present invention is not limited thereto. For example, in the plasma processing system of the present invention, the secondary electron amplification coating layer 117 or 117' may be formed only at the end wall 116 on which the plasma beam is produced by the upper circle loop coil 133.

Figure 9:
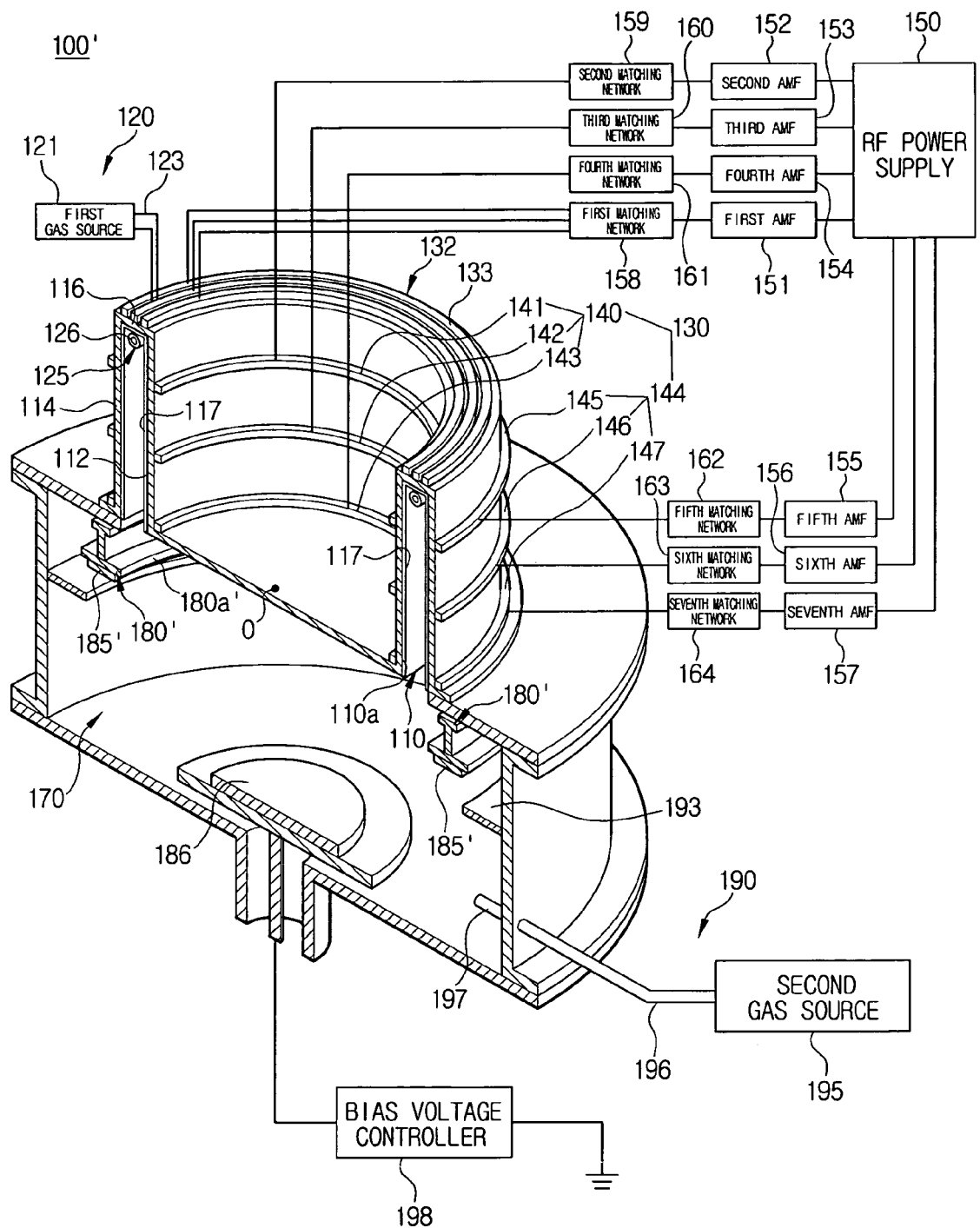
FIG. 9 is a schematic perspective view showing a plasma sputtering system including a plasma accelerating apparatus according to an exemplary embodiment of the present invention.

Although the plasma processing system with a plasma accelerating apparatus according to an exemplary embodiment of the present invention has also been described as a plasma etcher, which forms a selective etching pattern on a substrate 185 using high temperature plasma, the present invention is not limited thereto. For example, the plasma processing system of the present invention can be configured for use in a plasma sputtering system 100, shown in FIG. 9, which deposits a thin film on a substrate using the same construction and operation as those of the plasma processing system described above. In this case, as shown in FIG. 9, the plasma sputtering system 100' further includes a sputter target 186. A bias voltage generated by a bias voltage controller 198 is applied to the sputter target 186. The bias voltage may be predetermined. A substrate 185' is fixed to a substrate holder 180' above the sputter target 186. The substrate holder 180' is rotated based on a fixed axis (not shown) to uniformly deposit materials sputtered from the sputter target 186 on the substrate 185'. Also, the substrate holder 180' includes a circular opening 180a' through which the plasma beam accelerated in the plasma generating and accelerating portion 139 passes so that the plasma is guided to the sputter target 186. A horizontal baffle 193 is disposed at an upper portion of the second gas injection port 197 and controls gas pressure in the vicinity of the substrate 180'.

An operation of the plasma processing plasma system 100 having the aforementioned construction according to exemplary embodiments of the present invention will be now explained by reference to FIGS. 5 and 6. Firstly, a gas such as $C_2F_2$, $O_2$, or Ar, or other such gas known in the art, from the first gas source 121 is supplied into the plasma channel 110 through the first gas injection port 125. When the gas is supplied into the plasma channel 110, electrons of the gas generated by an RF energy applied by an upper circle loop inductor 132 collide with and neutral atoms of the gas, with the result that the gas is ionized to produce plasma beam. The upper circle loop inductor 132 operates by RF energy of about 1.8 kW at a frequency of about 2 MHz. At this time, since a secondary electron amplification coating layer 117 or 117' capable of providing optimum secondary electron emission effect is formed at inner surfaces of the inner wall 112, the external wall 114, and the end wall 116 of the plasma channel 110, generation efficiency of the plasma beam formed by the upper circle loop inductor 132 is enhanced.

Due to an electromagnetic force F generated by the internal and external circle loop inductors 140 and 144, and a pressure difference of a magnetic field among the first, second, and third internal circle loop coils 141, 142, and 143 of the internal circle loop inductor 140, and among the first, second, and third external circle loop coils 145, 146, and 147 of the external circle loop inductor 144, the plasma beam is accelerated toward an outlet port 110a of the plasma channel 110, and are discharged to an inside of the process chamber 170 through the outlet port 110a with plasma density of about $10^{11}$ to about $10^{12}$ electrons/cm$^3$ and ion energy of about 20 to about 500 eV.

The plasma beam discharged to the inside of the process chamber 170 through the outlet port 110a is moved toward a substrate 185 fixed to the substrate holder 180 of the process chamber 170. Further, the process gas from the second gas source 195 is supplied into the process chamber 170 through the second gas injection port 197 with a pressure of approximately 1 m Torr. Accordingly, the plasma beam collides with the process gas and becomes a directional or non-directional etching ion or atom. Consequently, a thin film such as photoresist of the substrate 185 disposed under a center of the plasma channel 110 inside the process chamber 170, is vaporized or carbonized to be etched with an etching rate of about 20 nm/min.

As apparent from the above description, in the plasma accelerating apparatus and the plasma processing system having the same according to exemplary embodiments of the present invention, since a second electron amplification coating layer capable of providing optimum secondary electron emission effect is formed at inner surfaces of the inner wall, the outer wall, and the end wall of the plasma channel, generation efficiency of plasma produced in the plasma channel is increased and accordingly an ion rate is also increased. Therefore, during a process of a semiconductor such as etching or sputtering, the performance of a plasma etcher or a plasma sputtering system may be optimized.

The foregoing embodiments and advantages are merely exemplary and are not to be construed as limiting the present invention. The present teaching can be readily applied to other types of apparatuses. Also, the description of exemplary embodiments of the present invention is intended to be illustrative, and not to limit the scope of the claims, and many alternatives, modifications, and variations will be apparent to those skilled in the art.

What is claimed is:

1. A plasma accelerating apparatus comprising:
   a channel comprising an inner wall; an outer wall spaced apart from the inner wall by a distance for encircling the inner wall, and an end wall connected to an end of the inner wall and an end of the outer wall to form an outlet port at the other ends of the inner and outer walls;
   a gas supply portion which is configured to supply a gas to an inside of the channel; and
   a plasma generating and accelerating portion which is configured to supply ionization energy to the gas inside the channel to generate a plasma beam and to accelerate the generated plasma beam toward the outlet port,
   wherein a coating layer comprising a first layer composed of a carbon nano tube is formed on an inner surface of at least one of the inner wall, the outer wall, and the end wall of the channel.

2. The apparatus as claimed in claim 1, wherein the first layer is about 10 µm or less in thickness.

3. The apparatus as claimed in claim 1, wherein the coating layer further comprises a second layer made of at least one of an oxide material and a fluoride material.

4. The apparatus as claimed in claim 3, wherein the oxide material is selected from MgO, CaO, and BaO, and the fluoride material is selected from $MgF_2$, LiF, CaF, and $BaF_6$.

5. The apparatus as claimed in claim 3, wherein the second layer is about 10 µm or less in thickness.

6. A plasma processing system comprising:
   a channel including an inner wall, an outer wall spaced apart from the inner wall by a predetermined distance for encircling the inner wall, and an end wall connected to an end of the inner wall and an end of the outer wall to form an outlet port at the other ends of the inner and outer walls;
   a first gas supply portion which is configured to supply a gas to an inside of the channel;
   a plasma generating and accelerating portion which is configured to supply ionization energy to the gas inside the channel to generate a plasma beam and to accelerate the generated plasma beam toward the outlet port; and
   a process chamber communicating with the outlet port of the channel, and including a substrate holder for fixing a substrate,
   wherein a coating layer including a first layer composed of a carbon nano tube is formed on an inner surface of at least one of the inner wall, the outer wall, and the end wall of the channel.

7. The system as claimed in claim 6, wherein the first layer is about 10 µm or less in thickness.

8. The system as claimed in claim 6, wherein the coating layer further comprises a second layer made of at least one of an oxide material and a fluoride material.

9. The system as claimed in claim 8, wherein the oxide material is selected from MgO, CaO, and BaO, and the fluoride material is selected from $MgF_2$, LiF, CaF, and $BaF_6$.

10. The system as claimed in claim 8, wherein the second layer is about 10 µm or less in thickness.

11. The system as claimed in claim 6, further comprising a second gas supply portion which is configured to supply a process gas into the process chamber.

* * * * *